(12) United States Patent
Lin et al.

(10) Patent No.: US 12,426,276 B2
(45) Date of Patent: Sep. 23, 2025

(54) SEMICONDUCTOR DEVICE, MEMORY CELL AND METHOD OF FORMING THE SAME

(71) Applicant: Taiwan Semiconductor Manufacturing Company, Ltd., Hsinchu (TW)

(72) Inventors: Yu-Chao Lin, Hsinchu (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 537 days.

(21) Appl. No.: 17/830,352

(22) Filed: Jun. 2, 2022

(65) Prior Publication Data

US 2023/0397439 A1   Dec. 7, 2023

(51) Int. Cl.
*H10B 63/00* (2023.01)
*H01L 23/528* (2006.01)
*H10N 70/00* (2023.01)

(52) U.S. Cl.
CPC ......... *H10B 63/24* (2023.02); *H01L 23/5283* (2013.01); *H10N 70/063* (2023.02); *H10N 70/841* (2023.02)

(58) Field of Classification Search
CPC .............................. H10B 63/24; H10F 10/325
See application file for complete search history.

(56) References Cited

U.S. PATENT DOCUMENTS

| | | | | |
|---|---|---|---|---|
| 11,778,921 | B2 * | 10/2023 | Hashemi | H10N 50/80 |
| | | | | 257/421 |
| 11,800,811 | B2 * | 10/2023 | Shen | H01F 41/34 |
| 2009/0196089 | A1 * | 8/2009 | Kang | H10N 70/826 |
| | | | | 423/326 |
| 2018/0375019 | A1 * | 12/2018 | Park | H10N 50/80 |
| 2022/0085105 | A1 * | 3/2022 | Park | H10N 70/826 |

* cited by examiner

*Primary Examiner* — Mounir S Amer
(74) *Attorney, Agent, or Firm* — JCIPRNET

(57) ABSTRACT

Provided is a memory cell including a selector disposed over a substrate, a memory element and a connecting pad. The selector includes a bottom electrode, an ovonic threshold switch layer on the bottom electrode, an inter-electrode over the ovonic threshold switch layer, and an intermediate layer between the ovonic threshold switch layer and the inter-electrode. The memory element is disposed on the selector. The connecting pad is disposed on the memory element.

20 Claims, 11 Drawing Sheets

SEMICONDUCTOR DEVICE, MEMORY CELL AND METHOD OF FORMING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density and higher numbers of semiconductor electronic components (e.g., transistors used for logic processing and memories used for storing information) of ever decreasing device dimensions. For example, the memories include non-volatile memory devices, where the non-volatile memory devices are capable of retaining data even after power is cut off. The non-volatile memory devices include resistive random-access memories and/or phase change random access memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
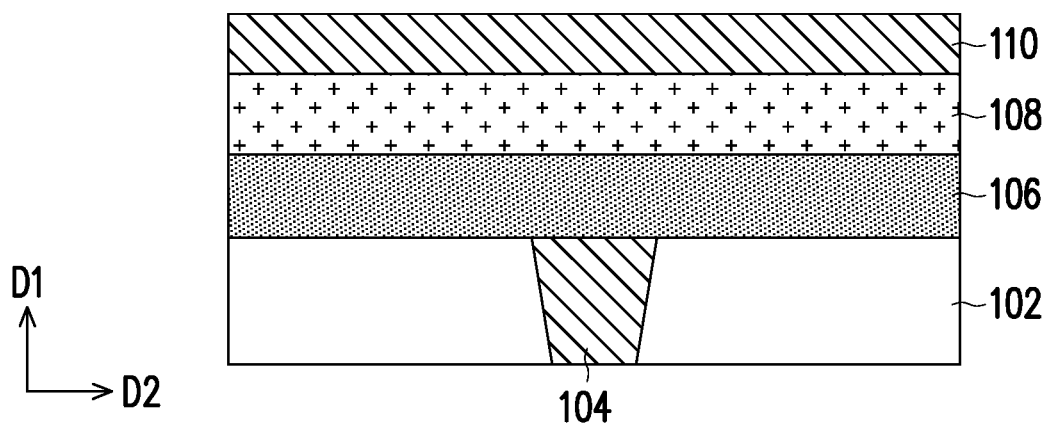
FIG. 1 to FIG. 6 are schematic sectional views of various stages in a method of forming a selector in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments discussed herein, a selector includes an intermediate layer sandwiched between a selector layer (such as a n ovonic threshold switch (OTS) layer) and an electrode. The intermediate layer may be served as a glue layer, an adhesive material, or a barrier layer. As such, the issue of peeling between the selector layer and the electrode can be avoided. In addition, the selector layer may be formed has a top area larger than that of the electrode to provide a more stable base to improve yield.

FIG. 1 to FIG. 6 are cross-sectional views of a method of forming a selector in accordance with some embodiments of the disclosure.

Referring to FIG. 1, a bottom electrode 104 is provided. For example, the bottom electrode 104 is embedded in a dielectric layer 102. In some embodiments, the dielectric layer 102 includes a dielectric material, such as silicon oxide, silicon nitride, silicon oxynitride, silicon carbonitride, silicon carbide oxynitride, spin-on glass (SOG), phosphosilicate glass (PSG), borophosphosilicate glass (BPSG), fluosilicate glass (FSG), carbon doped silicon oxide (e.g., SiCOH), polyimide, a spin-on dielectric material, a low-k dielectric material, or the like, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof.

In some embodiment, the dielectric layer 102 is formed by chemical vapor deposition (CVD) (e.g., flowable chemical vapor deposition (FCVD), plasma-enhanced chemical vapor deposition (PECVD), high density plasma CVD (HDPCVD) or sub-atmospheric CVD (SACVD)), molecular layer deposition (MLD), spin-on, sputtering, or other suitable methods. In one embodiment, the dielectric layer 102 is a one-layer structure. In some other embodiments, the dielectric layer 102 is a multi-layer structure. The disclosure is not limited thereto. In some embodiments, the dielectric layer 102 serves as an insulating layer.

As illustrated in FIG. 1, the bottom electrode 104 is formed in the dielectric layer 102 by a single damascene process. For example, an opening (not shown) is formed in the dielectric layer 102, and the opening is filled with a conductive material. Thereafter, a planarization process (e.g., a chemical-mechanical planarization (CMP) process) is performed to remove excessive conductive material, thereby forming the bottom electrode 104. In some embodiments, the surface of the bottom electrode 104 is exposed from a top surface of the dielectric layer 102. In certain embodiments, a top surface of the bottom electrode 104 is substantially coplanar with the top surface of the dielectric layer 102 after the planarization process.

In some embodiments, the bottom electrode 104 is electrically coupled to an overlying structure (e.g. coupled to a first conductive layer of a memory element formed in subsequent steps). In some embodiments, the bottom electrode 104 is configured to transmit the voltage applied to the bottom electrode 104 to a memory element located thereon. The bottom electrode 104 may be a single-layer structure (of one material) or a multilayer structure (of two or more different structure), and may be formed using CVD, atomic layer deposition (ALD), physical vapor deposition (PVD), a combination thereof, or the like. A material of the bottom electrode 104, for example, includes aluminum (Al), copper (Cu), tungsten (W), some other low resistance material, or a combination thereof. The bottom electrode 104 may have a round, square, or rectangular profile from a top view.

In some alternative embodiments, a barrier layer (not shown) is optionally formed between the bottom electrode 104 and the dielectric layer 102. For example, the barrier layer is located at the sidewalls of the bottom electrode 104 to physically separate the bottom electrode 104 and the dielectric layer 102. In some embodiments, the barrier layer includes a material to prevent the bottom electrode 104 from diffusing to the adjacent layers. The material of the barrier layer may include Ti, Ta, TiN, TaN, or other suitable material, and may be formed using CVD, ALD, PVD, a combination thereof, or the like. Furthermore, the barrier layer has a material different from that of the bottom electrode 104. For example, in one embodiment, the barrier layer includes TaN while the bottom electrode 104 includes TiN.

Figure 2:
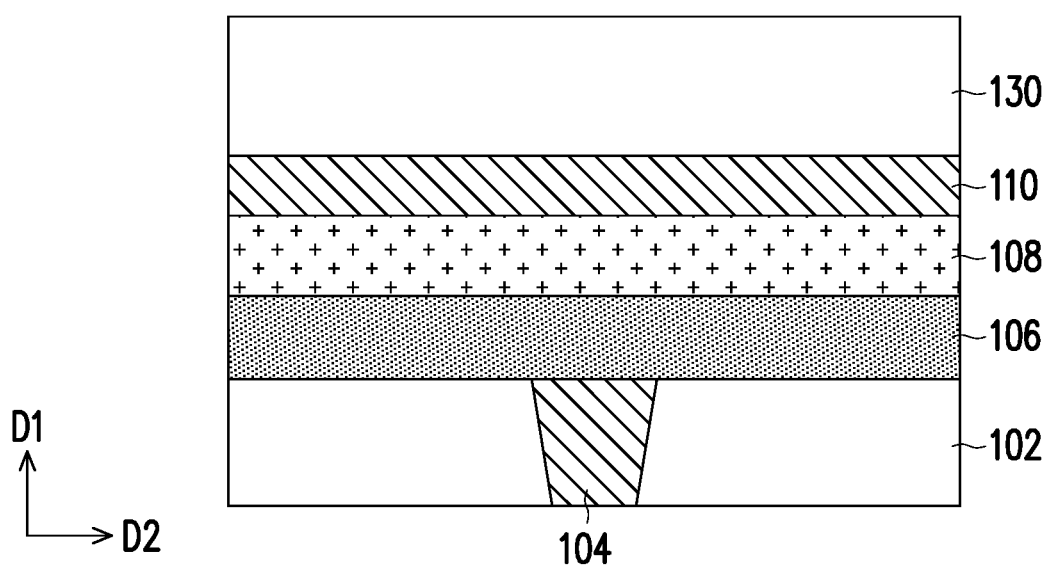
Figure 5:
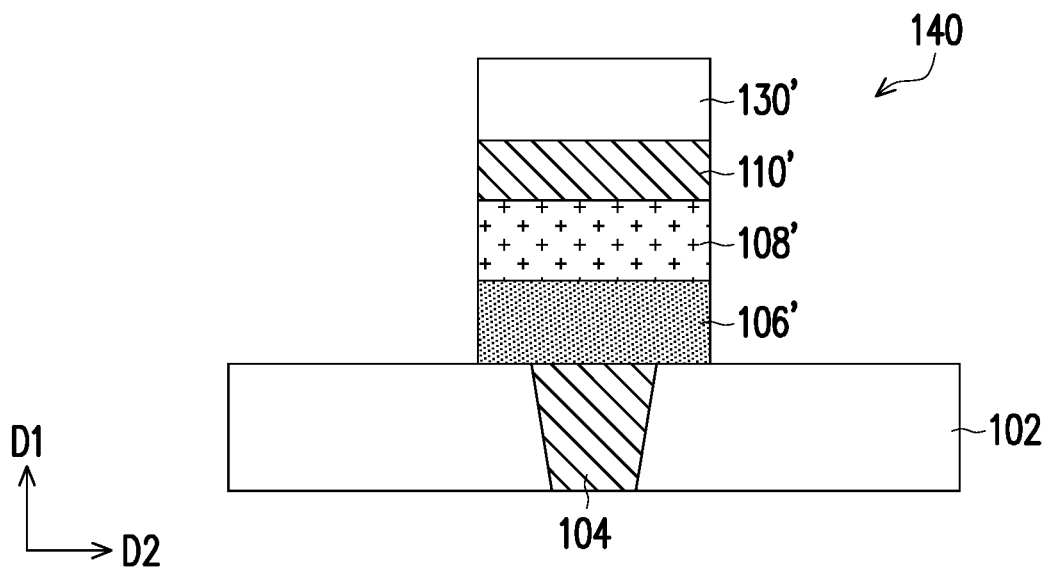

After forming the dielectric layer 102 and the bottom electrode 104, various steps of forming a selector 140 (as illustrated in FIG. 5) on the bottom electrode 104 will be described. Referring to FIG. 2, a selector material 106, an intermediate material 108, and an electrode material 110 are sequentially formed on the dielectric layer 102. For example, the selector material 106 is disposed between the dielectric layer 102 and the intermediate material 108, and further disposed between the bottom electrode 104 and the intermediate material 108. In some embodiments, the selector material 106 is in physical contact with the intermediate material 108, the dielectric layer 102, and the bottom electrode 104.

In some embodiments, a material of the selector material 106 includes an ovonic threshold switch (OTS) material. The OTS material is responsive to an applied voltage across the selector layer (106' illustrated in FIG. 6) formed in subsequent steps. For an applied voltage that is less than a threshold voltage, the selector layer (106' in FIG. 6) remains in an "off" state, e.g., an electrically nonconductive state. Alternatively, responsive to an applied voltage across the selector layer (106' in FIG. 6) that is greater than the threshold voltage, the selector layer (106' in FIG. 6) enters an "on" state, e.g., an electrically conductive state. That is, the selector layer (106' in FIG. 6) is referred to as a switch for determining to turn on or turn off the memory element (not shown).

The OTS material of the selector material 106 may include GeTe, AsGeSe, GeSbTe, GeSiAsTe, GeSe, GeSbSe, GeSiAsSe, GeS, GeSbS, GeSiAsS, or combinations thereof. Alternatively, the OTS material of the selector material 106 may include BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, or combinations thereof. The selector material 106 may be formed by any suitable method, such as PVD, ALD, or the like. In some embodiments, the selector material 106 has a thickness of about 5 nm to about 25 nm.

The intermediate material 108 may be referred to as a glue material, an adhesive material, or a barrier material. In some embodiments, the intermediate material 108 is conformally formed on and in physical contact with the selector material 106. In some embodiments, a hydrophilicity of the intermediate material 108 is greater than a hydrophilicity of the selector material 106, and less than a hydrophilicity of the electrode material 110. A hydrophobicity of the intermediate material 108 is greater than a hydrophobicity of the electrode material 110, and less than a hydrophobicity of the selector material 106. The intermediate material 108, for example, includes a conductive material such as a transition metal, such as Ti, Ni, Hf, Nb, La, Y, Gd, Zr, Co, Fe, Cu, V, Ta, W, Cr, and combinations thereof. For example, the electrode material 110 includes W. The intermediate material 108 may be formed by any suitable method, such as CVD, PVD, or the like. In some embodiments, an average grain diameter of the intermediate material 108 is less than an average grain diameter of electrode material 110. The electrode material 110 has a thickness of about 10 nm to about 30 nm.

In some embodiments, the electrode material 110 is conformally formed on and in physical contact with the intermediate material 108. The electrode material 110, for example, includes a conductive material, such as metal or alloy (e.g., Ti, Co, Cu, AlCu, W, TiW, TiAl, Pt) or metal compound (e.g., metal nitride such as TiN, TiAlN, TaN), or a combination thereof. The electrode material 110 may be formed by any suitable method, such as CVD, PVD, or the like. In some embodiments, the electrode material 110 has a thickness of about 15 nm to about 35 nm. In one embodiment, the material of the electrode material 110 is the same as or different from the material of the bottom electrode 104. In one embodiment, the materials of the intermediate material 108 and the selector material 106 are different from the materials of the bottom electrode 104 and the electrode material 110.

Referring to FIG. 2, in some embodiments, after the formations of the selector material 106, the intermediate material 108 and the electrode material 110, a hard mask material 130 is formed on the electrode material 110. The hard mask material 130, for example, includes a dielectric material, such as silicon oxide, silicon nitride, silicon oxynitride, silicon carbonitride, silicon carbide oxynitride, spin-on glass (SOG), phosphosilicate glass (PSG), borophosphosilicate glass (BPSG), fluosilicate glass (FSG), carbon doped silicon oxide (e.g., SiCOH), polyimide, a spin-on dielectric material, and/or a combination thereof. The hard mask material 130 may be formed by any suitable method, such as low temperature oxidation (LTO) process, CVD, FCVD, PECVD, HDPCVD, SACVD, molecular layer deposition (MLD), spin-on, sputtering, or other suitable methods. In some embodiments, the hard mask material 130 is silicon oxide and formed by low temperature oxidation (LTO) process performed at a temperature of about 180° C. to about 350° C. The hard mask material 130 has a thickness of about 100 nm to about 400 nm, for example.

Figure 3:
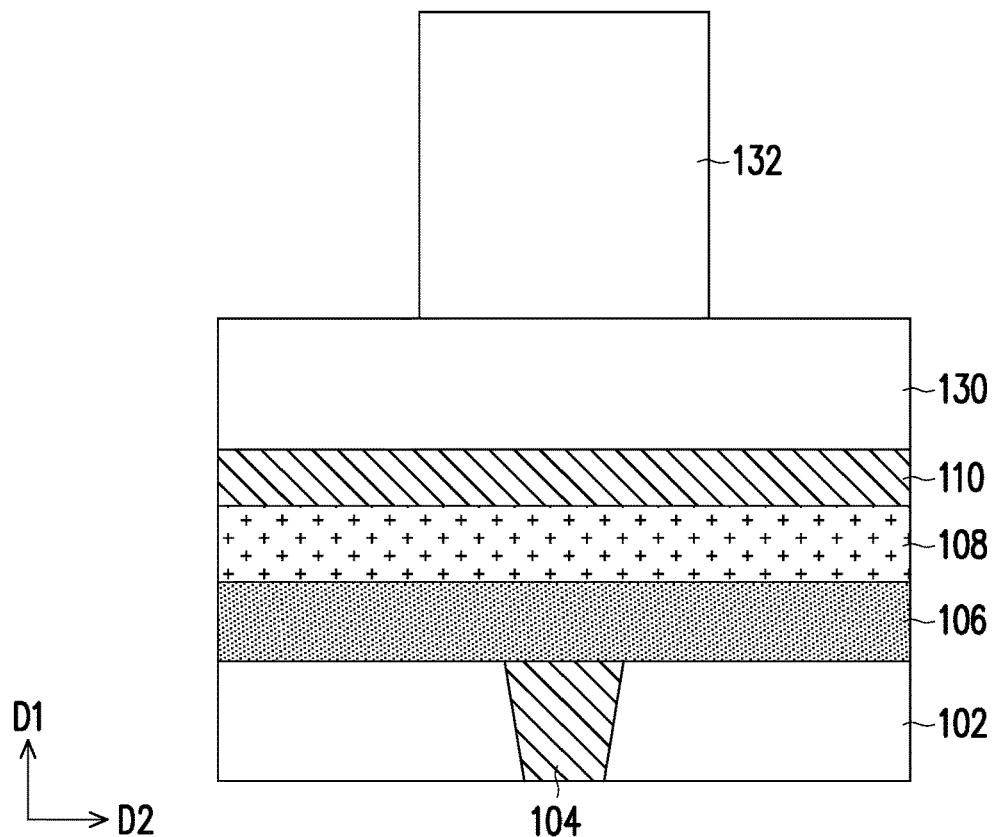

Referring to FIG. 3, in some embodiments, a photoresist pattern 132 is formed on the hard mask material 130 along the first direction D1. The photoresist pattern 132 may be formed by coating (such as spin-coating) and photolithography processes or the like; however, the disclosure is not limited thereto. A material of the photoresist pattern 132, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern 132 is referred to as a photoresist layer or a resist layer.

Figure 4:
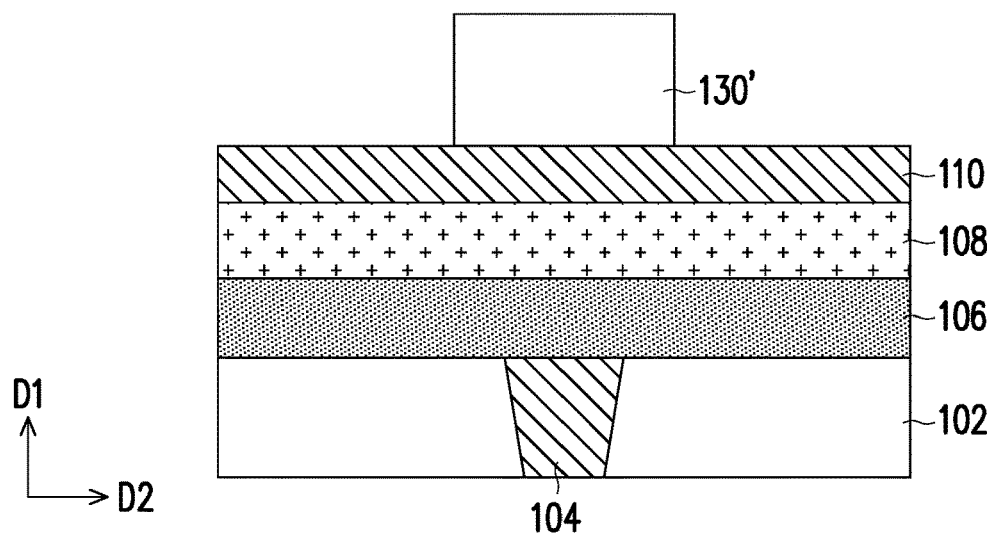

Referring to FIG. 4, a first patterning process is performed to pattern the hard mask material 130 to form a hard mask layer 130'. For example, the first patterning process is performed by using the photoresist pattern (or referred to as a pattern mask layer) 132 as a mask, and independently include an etching step, such as a dry etching, a wet etching or a combination thereof. Thereafter, the photoresist pattern 132 is removed by acceptable ashing process and/or photoresist stripping process. For example, in one embodiment, the photoresist pattern 132 is removed using high pressure oxygen plasma, or the like. The disclosure is not limited thereto.

Referring to FIG. 5, a second patterning process is performed to pattern the electrode material 110, the intermediate material 108, and the selector material 106 to respectively form an electrode 110', an intermediate layer 108', and a selector layer (or referred to as an ovonic threshold switch layer) 106'. For example, the second patterning process is performed by using the hard mask layer 130' as a mask, and independently include at least one etching step, such as a dry etching, a wet etching or a combination thereof. In some embodiments, the second patterning process includes a first dry etching process to selectively remove the electrode material 110 and the intermediate material 108, and a second dry etching process to selectively remove the selector material 106. The first dry etching process is performed by applying a gas mixture of $SF_6$, $Cl_2$, $N_2$, Ar, or a combination thereof. The second dry etching process is performed by applying a gas mixture of $CF_4$, $N_2$, Ar, or a combination thereof.

Up to here, a selector 140 according to some embodiments of the present disclosure is accomplished. The selector 140 includes the hard mask layer 130', the electrode 110', the intermediate layer 108', the selector layer 106', and the bottom electrode 104'. The selector layer 106' is disposed on and physically connected to the bottom electrode 104. The selector layer 106' is located in between the bottom electrode 104' and the intermediate layer 108', and between the dielectric layer 102 and the intermediate layer 108. The intermediate layer 108' is sandwiched between and physically in contact with the electrode 110' and the selector layer 106'. The electrode 110' is located and physically in contact with the intermediate layer 108' and the hard mask layer 130'. In other words, the hard mask layer 130', the electrode 110', the intermediate layer 108', and the selector layer 106' are stacked up along the first direction D1, and are extending along a second direction D2. The second direction D2 is perpendicular to the first direction D1.

Figure 6:
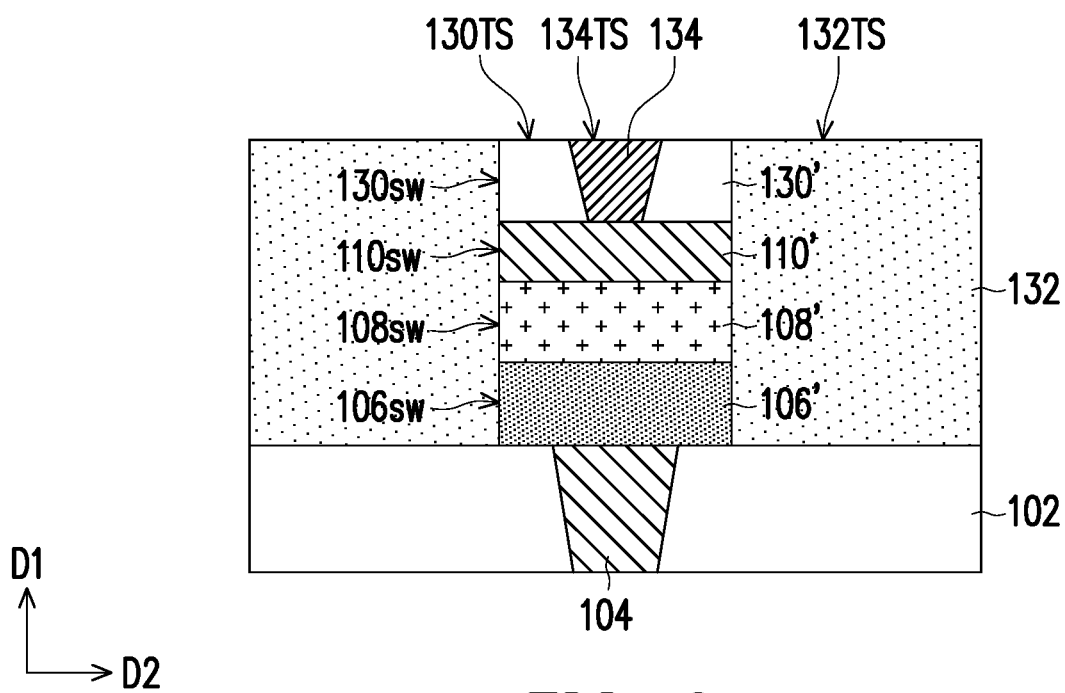

Referring to FIG. 6, a dielectric layer 132 is formed on the dielectric layer 102 to cover and surround the selector 140. The dielectric layer 132 covers sidewalls 130sw of the hard mask layer 130', sidewalls 110sw of the electrode 110', sidewalls 108sw of the intermediate layer 108', and sidewalls 106sw of the selector layer 106'. In some embodiments, a planarization process (e.g., a chemical-mechanical planarization (CMP) process) is performed to remove excessive dielectric materials of the dielectric layer 132, so that a top surface 132TS of the dielectric layer 132 is substantially coplanar with a top surface 130TS of the hard mask layer 130. The dielectric layer 132 and the dielectric layer 102 may be collectively referred to as an inter-metal dielectric (IMD) layer.

Referring to FIG. 6, in a subsequent step, a via 134 is formed in the hard mask layer 130' by a single damascene process. For example, an opening (not shown) is formed in the hard mask layer 130', and the opening is filled with a conductive material. Thereafter, a planarization process (e.g., a chemical-mechanical planarization (CMP) process) is performed to remove excessive conductive material, thereby forming the via 134. In some embodiments, a top surface 134TS of the via 134 is exposed from the top surface 130TS of the hard mask layer 130'. In some embodiments, a top surface 134TS of the via 134 is substantially coplanar with the top surface 130TS of the hard mask layer 130' after the planarization process.

In some alternative embodiments, a barrier layer (not shown) is optionally formed between the via 134 and the hard mask layer 130'. For example, the barrier layer is located at the sidewalls of the bottom electrode 104 to physically separate the via 134 and the dielectric layer 102. In some embodiments, the barrier layer includes a material to prevent the via 134 from diffusing to the adjacent layers. The material of the barrier layer may include Ti, Ta, TiN, TaN, or other suitable material, and may be formed using CVD, ALD, PVD, a combination thereof, or the like. Furthermore, the barrier layer has a material different from that of the via 134. For example, in one embodiment, the barrier layer includes TaN while the via 134 includes TiN.

Figure 7:
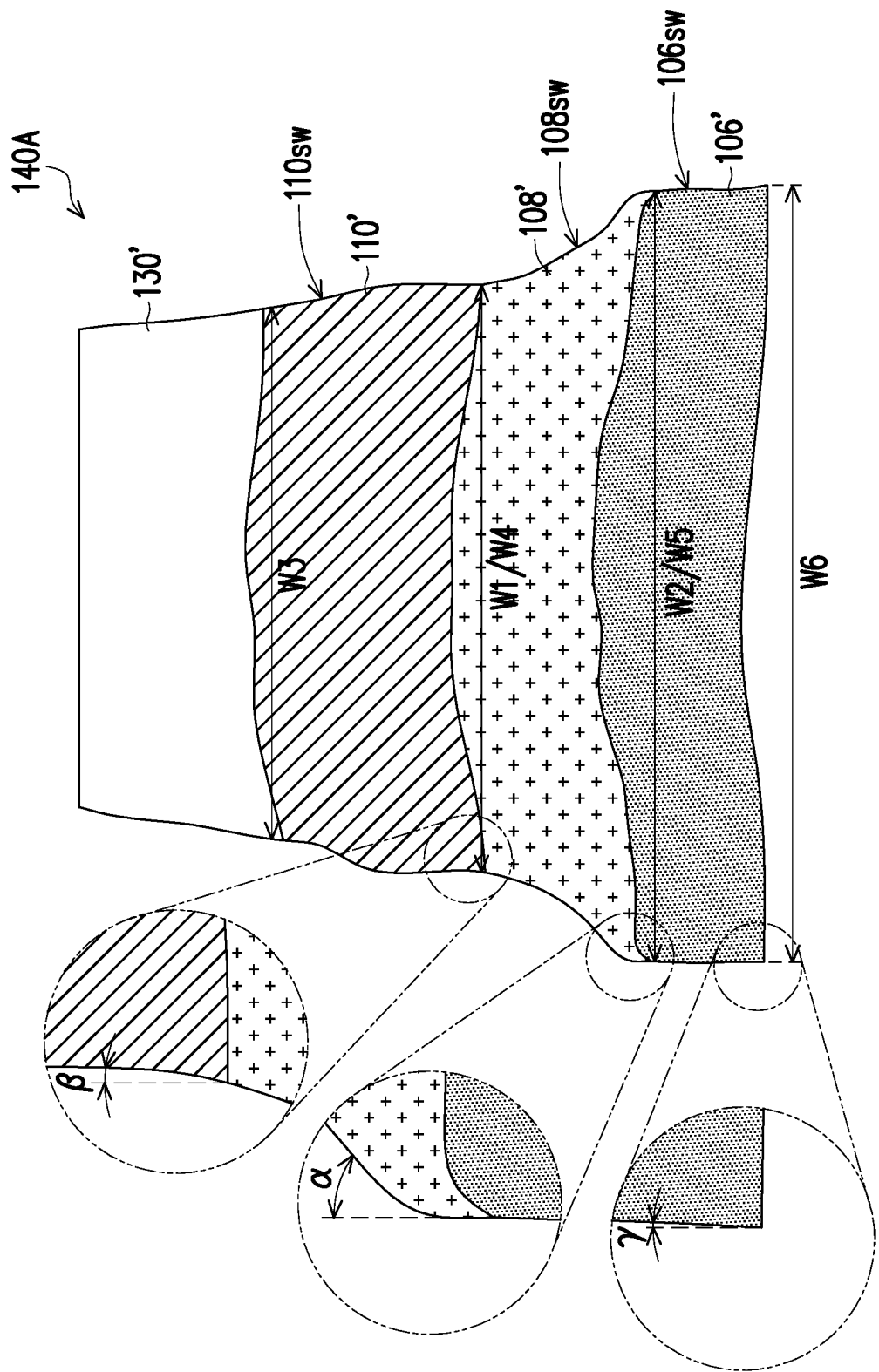
FIG. 7 is a schematic sectional view of a selector in accordance with some other embodiments of the present disclosure.

FIG. 7 is a schematic sectional view of a portion of a selector 140A in accordance with some other embodiments of the present disclosure. The selector 140A illustrated in FIG. 7 is similar to the selector 140 illustrated in FIG. 6. Therefore, the same reference numerals are used to refer to the same or liked parts, and its detailed description will be omitted herein.

Referring to FIG. 7, the selector 140A includes a hard mask layer 130', an electrode 110', an intermediate layer 108', and a selector layer 106' over a substrate (not shown), and a bottom electrode (not shown) between the selector layer 106' and the substrate. The intermediate layer 108' is inserted between the electrode 110' and the sector layer 106'. A top width W1 of the intermediate layer 108' is equal to or smaller than a bottom width W2 of the intermediate layer 108'. The bottom width W2 of the intermediate layer 108' to the top width W1 of the intermediate layer 108' has a second ratio $R_2$.

The electrode 110' is located on the intermediate layer 108'. A top width W3 of the electrode 110' is equal to or smaller than a bottom width W4 of the electrode 110'. The bottom width W4 of the electrode 110' to the top width W3 of the electrode 110' has a first ratio $R_1$. The selector layer 106' is located below the intermediate layer 108'. A top width W5 of the selector layer 106' is substantially equal to a bottom width W6 of the selector layer 106'. The bottom width W6 of the selector layer 106' to the top width W5 of the selector layer 106' has a third ratio $R_3$. In some embodiments, the second ratio $R_2$ is greater than the first ratio $R_1$ and the third ratio $R_3$.

In some embodiments, an average width of selector layer 106' is greater than an average width of the intermediate layer 108', and the average width of the intermediate layer 108' is greater than an average of the electrode 110'.

In some embodiments, a width of the intermediate layer 108' increases toward the selector layer 106'. The intermediate layer 108' has curved sidewalls 108sw. A width of the electrode 110' increases toward the selector layer 106'. The electrode 110' has curved sidewalls 110sw. A width of the selector layer 106' is substantially the same form top to bottom. The sidewalls 106sw of the selector layer 106' are substantially vertical or slightly tilted.

The curved sidewalls 108sw of the intermediate layer 108', the curved sidewalls 110sw of the electrode 110', and the sidewalls 106sw of the selector layer 106' have different slopes. The curved sidewall 108sw of the intermediate layer 108' has an included angle $\alpha$ with respect to the normal direction of a substrate (not shown) on which the selector layer 106', the intermediate layer 108', and the electrode 110' formed thereon. In some embodiment, the included angle $\alpha$ is in a range of 30 degrees to 60 degrees. The curved sidewall 110sw of the electrode 110' has an included angle $\beta$ with respect to the normal direction of the substrate. The sidewall 106sw of the selector layer 106' has an included angle $\gamma$ with respect to the normal direction of the substrate. In some embodiments the included angle $\alpha$ is greater than the included angle $\beta$, and the included angle $\beta$ is greater than the included angle $\gamma$.

In other word, the selector layer 106' has a top surface area greater than a top surface area of the electrode 110', and thus the selector layer 106' has a more stable base to improve yield.

Figure 10:
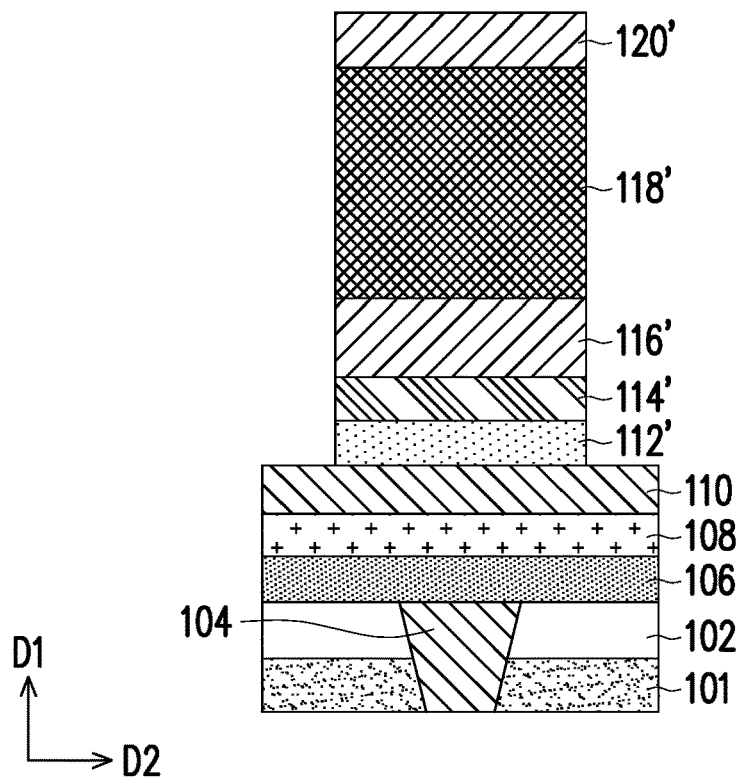
Figure 11:
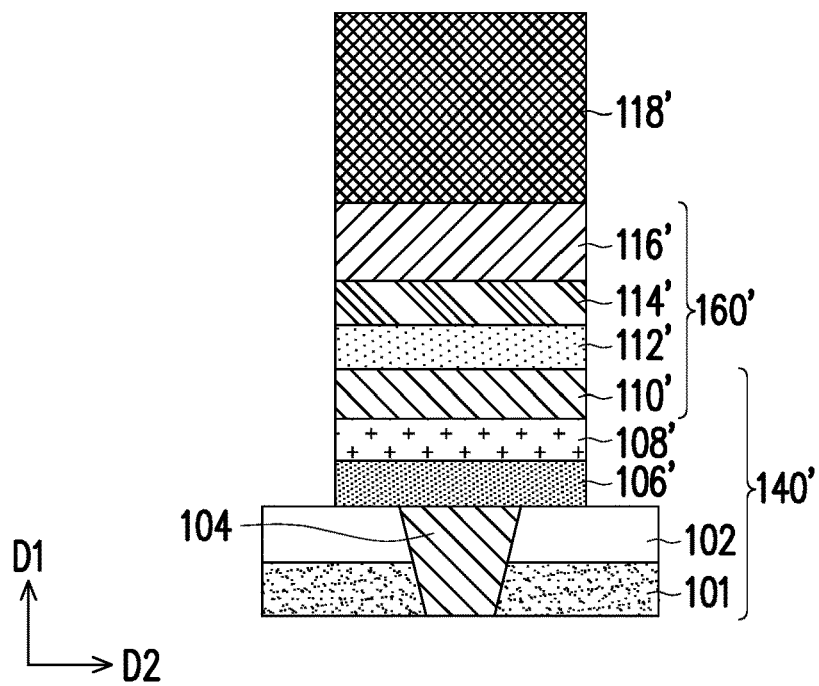
Figure 12:
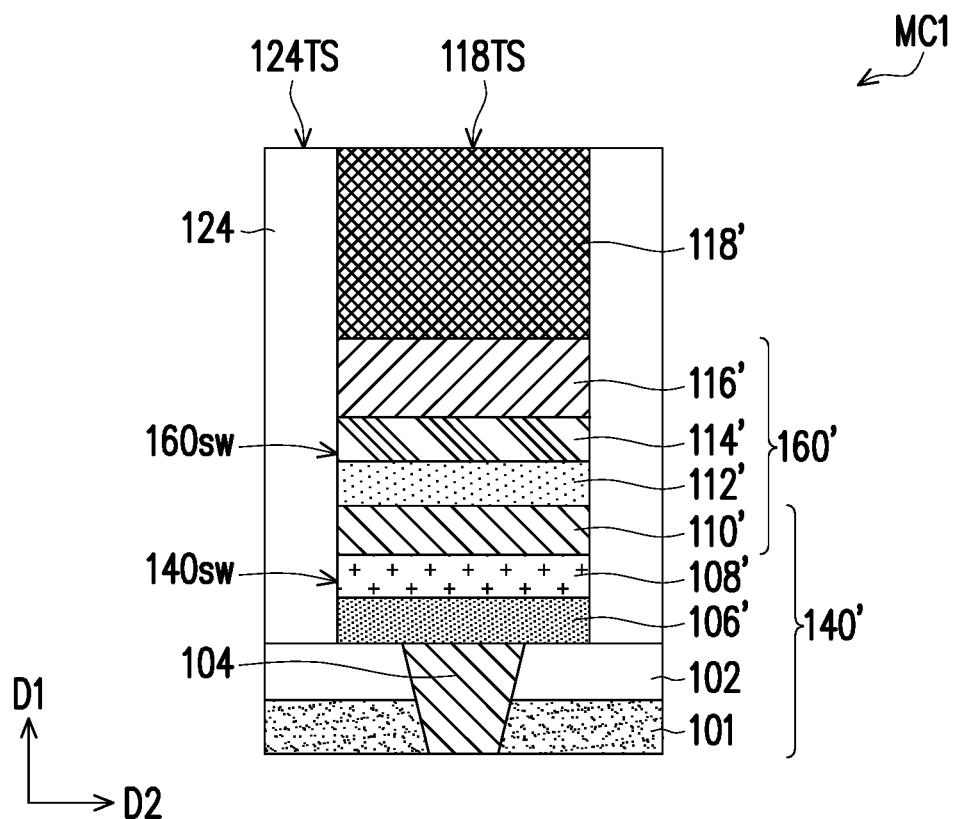

FIG. 8 to FIG. 12 are schematic sectional views of various stages in a method of forming a memory cell with a selector in accordance with some embodiments of the present disclosure. In some embodiments, the memory cell is applied to a resistive random-access memory (RRAM) cell, hereinafter referred to as a RRAM cell as illustrated in FIG. 8 through FIG. 12. The RRAM cell may include one or more than one RRAM element or device. The selector 140' illustrated in FIG. 12 is similar to the selector 140 illustrated in FIG. 6. Therefore, the same reference numerals are used to refer to the same or liked parts, and its detailed description will be omitted herein.

Figure 8:
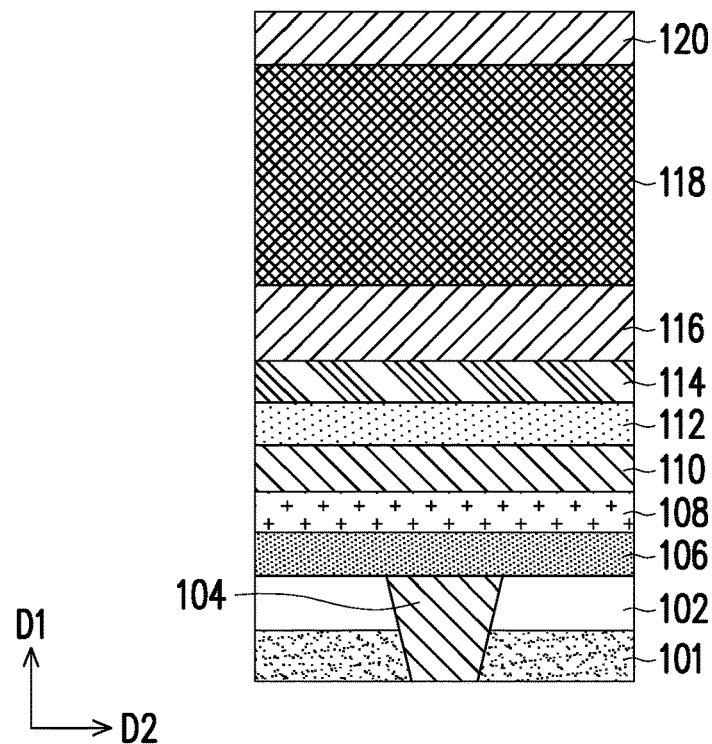
FIG. 8 to FIG. 12 are schematic sectional views of various stages in a method of forming a memory cell in accordance with some embodiments of the present disclosure.

Referring to FIG. 8, a bottom electrode 104 is embedded in a dielectric layer 102 and an etch stop layer 101 below the dielectric layer 102. The etch stop layer 101 and the dielectric layer 102 have different materials. In some embodiments, the etch stop layer 101 includes silicon carbide, silicon nitride, silicon oxynitride, silicon carbonitride, silicon carbide oxynitride or the like, and/or a combination thereof. In some embodiment, the etch stop layer 101 is formed by chemical vapor deposition (CVD) (e.g., flowable chemical vapor deposition (FCVD), plasma-enhanced chemical vapor deposition (PECVD), high density plasma CVD (HDPCVD) or sub-atmospheric CVD (SACVD)), molecular layer deposition (MLD), spin-on, sputtering, or other suitable methods. In one embodiment, the etch stop layer 101 is a one-layer structure. In some other embodiments, the etch stop layer 101 is a multi-layer structure. The disclosure is not limited thereto.

The dielectric layer 102 is formed on the etch stop layer 101 and the bottom electrode 104 is formed in the dielectric layer 102 and the etch stop layer 101. Thereafter, a selector material 106, an intermediate material 108, and an electrode material (or referred to as an inter-electrode material) 110 are stacked on the dielectric layer 102 and the bottom electrode 104 along a first direction D1 (e.g. a build-up direction). After forming the electrode material 110, various steps of forming a memory element 160' (as illustrated in FIG. 11) on the electrode material 110 will be described.

Referring to FIG. 8, a storage element material 112 and a conductive material 116 are sequentially formed over the electrode material 110 along the first direction D1 (e.g. the build-up direction).

In some embodiments, the storage element material 112 is conformally formed on and is connected to the electrode material 110. For example, the storage element material 112 is in physical contact with the electrode material 110. The storage element material 112 is located in between the electrode material 110 and the conductive material 116. The storage element material 112 may be formed by any suitable method, such as PVD, ALD, or the like. A material of the storage element material 112 is different from the material of the selector material 106. In some embodiments, the storage element material 112 includes a variable resistance dielectric material (also referred to as a resistance changeable material) used for the RRAM element or device. For example, the variable resistance dielectric material includes a transition metal oxide material, such as hafnium oxide (such as HfO or $HfO_2$, etc.), niobium oxide ($NbO_x$), lanthanum oxide ($LaO_x$), gadolinium oxide ($GdO_x$), vanadium oxide ($VO_x$), yttrium oxide ($YO_x$), zirconium oxide ($ZrO_x$), titanium oxide ($TiO_x$), tantalum oxide ($TaO_x$), nickel oxide ($NiO_x$), tungsten oxide ($WO_x$), chromium oxide ($CrO_x$), copper oxide ($CuO_x$), cobalt oxide ($CoO_x$) or iron oxide ($FeO_x$), and combination thereof. The storage element material 112 may have a thickness of about 1 nm to about 10 nm.

In some embodiments, the conductive material 116 is conformally formed on the storage element material 112. For example, the conductive material 116 is connected to the storage element material 112. The conductive material 116, for example, includes a conductive material, such as metal or alloy (e.g., Ti, Co, Cu, AlCu, W, TiW, TiAl, Pt) or metal compound (e.g., metal nitride such as TiN, TiAlN, TaN), or a combination thereof. The conductive material 116 may be a single-layer structure (of one material) or a multilayer structure (of two or more different structure).

In one embodiment, the materials of the conductive material 116 and the electrode material 110 are the same. For example, the conductive material 116 and the electrode material 110 both include TiN. In an alternative embodiment, the materials of the electrode material 110 and the conductive material 116 are different. The conductive material 116 may be formed by any suitable method, such as CVD, PVD, or the like. In some embodiments, the conductive material 116 has a thickness of about 20 nm to about 50 nm.

In some embodiments, an adhesive material 114 is optionally formed between the conductive material 116 and the storage element material 112 to enhance the adhesion between the conductive material 116 and the storage element material 112. Owing to the adhesive material, a delamination at the interface of the conductive material 116 and the storage element material 112 may be prevented. The adhesive material 114 may be made of a transition metal, such as Ti, Ni, Hf, Nb, La, Y, Gd, Zr, Co, Fe, Cu, V, Ta, W, Cr, and combinations thereof, and may be formed by CVD or the like. For example, the adhesive material includes Ti while the conductive material 116 includes TiN. In the disclosure, the material of the adhesive material 114 may be selected based on the materials of the layers located underlying and overlying thereto. In some embodiments, the adhesive material 114 has a thickness of about 10 nm to about 50 nm. Alternatively, with the sufficient adhesion between the conductive material 116 and the storage element material 112 that is capable of preventing the delamination therebetween, the adhesive material 114 may be optional, the disclosure is not limited thereto.

As further illustrated in FIG. 8, in some embodiments, the connecting pad material 118 is formed on the conductive material 116. For example, the connecting pad material 118 is in physical contact with and electrically connected to the conductive material 116. The connecting pad material 118, for example, includes a conductive material, such as W, Ti, Co, Cu, AlCu, TiN, TiW, TiAl, TiAlN, TaN, Pt, or a combination thereof. The connecting pad material 118 may be formed by any suitable method, such as CVD, PVD, or the like. In some embodiments, the connecting pad material 118 has a thickness of about 100 nm to about 200 nm. In one embodiment, the material of the connecting pad material 118 is different from the material of the electrode material 110 and/or the material of the conductive material 116. For example, the connecting pad material 118 includes AlCu.

Referring to FIG. 8, in a subsequent step, the hard mask layer 120 is disposed over the connecting pad material 118. For instance, in one embodiment, the hard mask layer 120 includes TiN. Furthermore, the hard mask layer 120 may be formed by any suitable methods, such as CVD, PVD, ALD or the like.

Referring to FIG. 9 to FIG. 12, various steps of performing a patterning process to define a memory cell MC1 is described.

Figure 9:
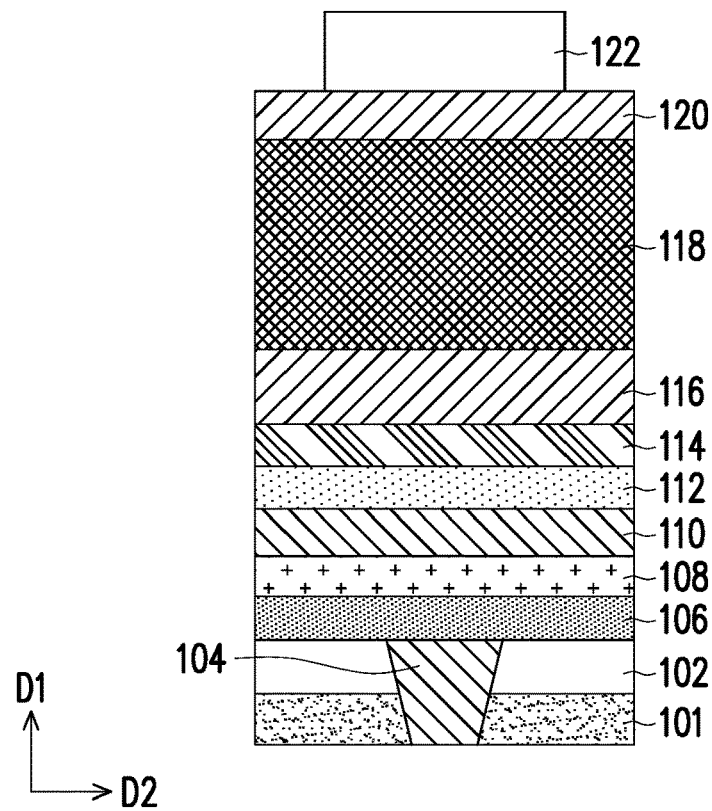

As illustrated in FIG. 9, in some embodiments, a photoresist pattern (or referred to as patterned mask layer) 122 is formed on the hard mask layer 120. The photoresist pattern 122 may be located whin an area corresponding to a center position of the bottom electrode 104. In other words, the photoresist pattern 122 is stacked up over the bottom electrode 104 in the first direction D1. The photoresist pattern 122 may have a round, square, or rectangular profile in the top view, which may be adjusted based on design requirement.

In one embodiment, the photoresist pattern 122 may be formed by coating (such as spin-coating) and photolithography processes or the like; however, the disclosure is not limited thereto. A material of the photoresist pattern 122, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern 122 is referred to as a photoresist layer or a resist layer. As shown in FIG. 9, for example, along the first direction D1 and the second direction D2, a size of the photoresist pattern 122 is greater than a size of the bottom electrode 104.

Referring to FIG. 10, in some embodiments, a first patterning process is performed to pattern the hard mask layer 120. For example, in some embodiments, the first patterning process includes a step of etching the hard mask layer 120 (e.g. TiN) using Cl$_2$/BCl$_3$ based plasma. After the first etching process, sidewalls of the hard mask layer 120 are aligned with sidewalls of the photoresist pattern 122 (shown in FIG. 9).

In some embodiments, the photoresist pattern 122 is removed after the first etching process by acceptable ashing process and/or photoresist stripping process. For example, in one embodiment, the photoresist pattern 122 is removed using high pressure oxygen plasma, or the like. The disclosure is not limited thereto. After removing the photoresist pattern 122, a hard mask layer 120' is retained over the connecting pad material 118.

Referring to FIG. 10, in some embodiments, a second patterning process is performed to pattern the connecting pad material 118, the conductive material 116, the adhesive material 114, and the storage element material 112. For example, the second patterning process is performed by using the photoresist pattern 122 as a mask. The second etching process may be a dry etching, a wet etching or a combination thereof. In some embodiments, the connecting pad material 118, the conductive material 116, the adhesive material 114, and the storage element material 112 are patterned to respectively form a connecting pad 118', a top electrode 116', an adhesive layer 114', and a storage layer 112'.

Referring to FIG. 11, a third patterning process is performed to pattern the electrode material 110, the intermediate material 108 and the selector material 106. For example, the third patterning process is performed by using the hard mask layer 120' as a mask. The third patterning process may be a dry etching, a wet etching or a combination thereof. In some embodiments, the electrode material 110, the intermediate material 108 and the selector material 106 are patterned to form an electrode (or referred to as an inter-electrode) 110', an intermediate layer 108' and a selector layer 106'. The hard mask layer 120' may be removed during the third etch process or after the third etch process by a dry etching, a wet etching or a combination thereof. For example, the third patterning process is performed by using the hard mask layer 120' as a mask, and independently include at least one etching step, such as a dry etching, a wet etching or a combination thereof. In some embodiments, the third patterning process includes a first dry etching process to selectively remove the electrode material 110 and the intermediate material 108, and a second dry etching process to selectively remove the selector material 106. The first dry etching process is performed by applying a gas mixture of SF$_6$, Cl$_2$, N$_2$, Ar, or a combination thereof. The second dry etching process is performed by applying a gas mixture of CF$_4$, N$_2$, Ar, or a combination thereof.

Up to here, a memory element 160' and a selector 140' according to some embodiments of the present disclosure is accomplished. The memory element 160' includes the top electrode 116', the adhesive layer 114, the storage layer 112', and the electrode 110'. The connecting pad 118' is located on the top electrode 116' of the memory element 160'. The storage layer 112' of the memory element 160' is sandwiched between the top electrode 116' and the electrode 110'. The adhesive layer 114' is disposed between the top electrode 116' and the storage layer 112'.

In some embodiments, the memory element 160' is a metal-insulator-metal (MIM) structure and is referred to as an RRAM (resistive random access memory) device. In some embodiments, electrode 110 is referred to as a bottom electrode of the RRAM and the top electrode 116' is referred to as a top electrode of the RRAM.

Generally, a RRAM device or element (e.g., the memory element 160') operates under the principle that a dielectric material/layer, which is normally insulating, can be made to conduct through a filament or conduction path formed after the application of a sufficiently high voltage. The conduction path formation can arise from different mechanisms, including but not limited to defect, metal migration, oxygen vacancy, etc. As described above, during a write operation to the memory element 160', a 'set' voltage is applied across the top and bottom electrodes to change the variable resistance dielectric material from a first resistivity (e.g., a high resistance state (HRS), where a filament or conduction path between the top and bottom electrodes are broken) to a second resistivity (e.g., a low resistance state (LRS), where the filament or conduction path between the top and bottom electrodes are established).

Similarly, a 'reset' voltage is applied across the top and bottom electrodes to change the variable resistance dielectric material from the second resistivity back to the first resistivity, for example, from LRS to HRS. Therefore, in instances where the LRS and HRS correspond to logic "1" and logic "0" states (or vice versa), respectively; the 'set' and 'reset' voltages can be used to store digital information bits in the RRAM cell (e.g. memory cell MC1 in FIG. 12) through the memory element 160' to provide relevant memory functions.

The selector 140' is electrically coupled to the memory element 160 through the electrode 110'. The selector 140' includes the electrode 110', the intermediate layer 108', the selector layer 106', and the bottom electrode 104'. The electrode 110' disposed between the storage layer 112' and the intermediate layer 108'. The selector layer 106' is sandwiched between the electrode 110' and the bottom electrode 104, and further sandwiched between the electrode 110' and the dielectric layer 102. The intermediate layer 108' is inserted between and in contact with the electrode 110' and the selector layer 106'. In some embodiments, the electrode 110', the intermediate layer 108', the selector layer 106', and the bottom electrode 104' of the selector 140' may be contoured similarly to the contours of the electrode 110', the intermediate layer 108', the selector layer 106', and the bottom electrode 104' of the selector 140A shown in FIG. 7.

Referring to FIG. 12, in a subsequent step, a dielectric layer 124 is formed on the dielectric layer 102 to cover and surround the memory element 160' and the selector 140'. For example, the dielectric layer 124 covers sidewalls 160*sw* of the memory element 160', and sidewalls 140*sw* of the selector 140'. In some embodiments, a planarization process (e.g., a chemical-mechanical planarization (CMP) process) is performed to remove excessive dielectric materials of the dielectric layer 124, so that a top surface 124TS of the dielectric layer 124 is substantially coplanar with a top surface 118TS of the connecting pad 118'. Up to here, a memory cell MC1 according to some embodiments of the present disclosure is accomplished. In some embodiments, the dielectric layer 102 and the dielectric layer 124 are collectively referred as an interlayer dielectric (ILD) of the memory cell MC1.

As illustrated in FIG. 12, the selector 140' is electrically coupled to the memory element 160' in the memory cell MC1. For example, the memory element 160' is electrically connected to the selector 140' through the electrode 110'. That is, the memory element 160' is electrically coupled to the selector 140' in series. With such configuration, the voltage may be applied to the selector 140' for controlling the status (e.g. "on" or "off") of the memory element 160'. While the memory element 160' is turned on, the voltages are further applied to the electrode 110' and the top electrode 116' of the memory element 160' for operating the memory functions thereof (via HRS and LRS). As illustrated in FIG. 12, the memory cell MC1 has one selector 140' and one memory element 106' electrically connected to each other and located between the overlying interconnection structures and underlying interconnection structures (not shown). In other words, the memory cell MC1 is implemented as a 1-selector-1-resistor (1S1R) configuration. However, the disclosure is not limited thereto, and in other embodiments, the memory cell may include one selector 140' and a plurality of memory elements electrically connected to the selector 140'. In some other embodiments, the memory cell MC1 is implemented as a 1-selector-1-transistor-1-resistor (1S1T1R) configuration.

In the exemplary embodiment, for the memory cell MC1, the intermediate layer 114' of the selector 140' is inserted between the electrode 110' and the selector layer 106', and thus the connection between the electrode 110' and the selector layer 106' is ensured. The sidewall of the intermediate layer 108' is designed to have sidewalls having an included angle in a range of 30 degrees to 60 degrees. As such, the critical dimensions of the selector layer 106' may be appropriately controlled so that the selector layer 106' has a surface area greater than a top surface area of the electrode 110 (shown in FIG. 7) to avoid bending or collapse of the memory cell MC1.

Overall, peeling or contact failure between the electrode 110 and the selector layer 106' and bending or collapse of the memory cell MC1 may be avoided.

Figure 13:
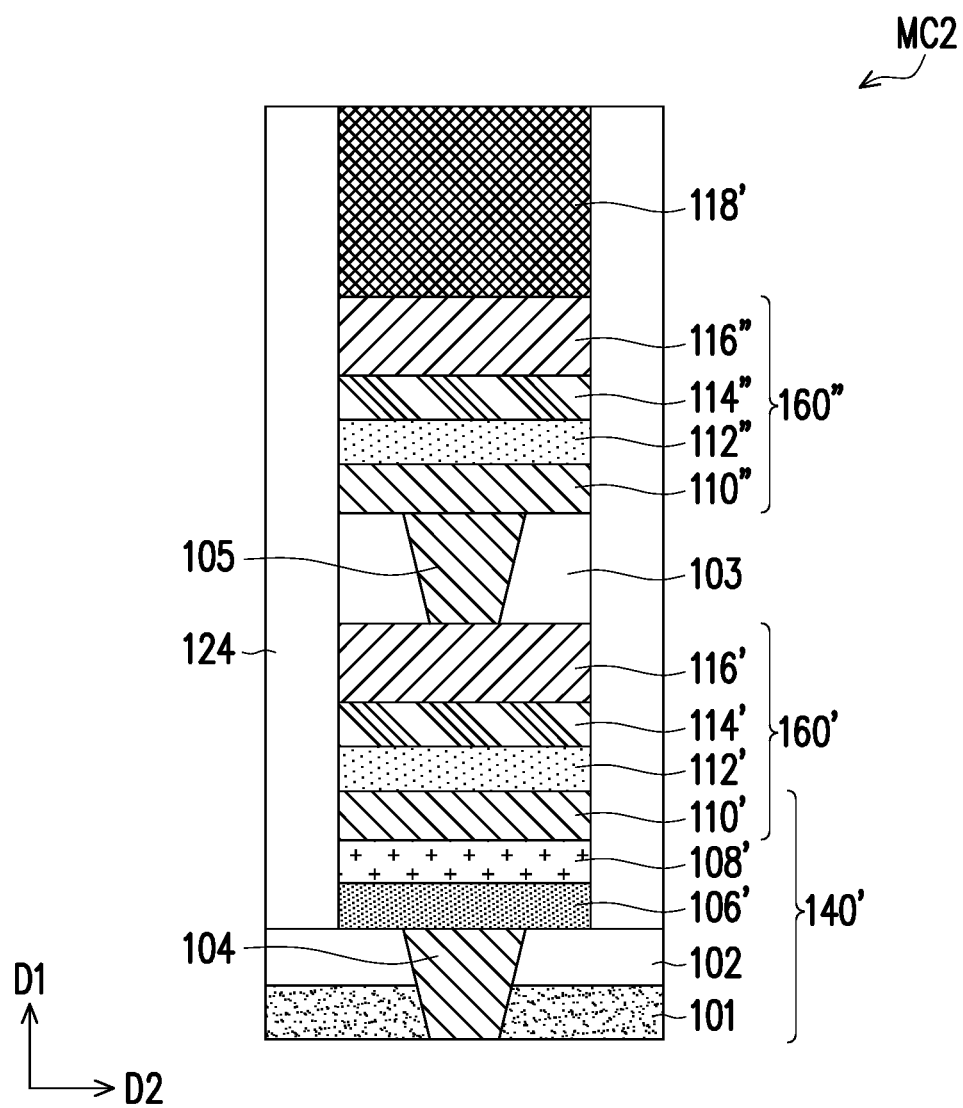
FIG. 13 is a schematic sectional view of a memory cell in accordance with some other embodiments of the present disclosure.

FIG. 13 is a schematic sectional view of a memory cell in accordance with some other embodiments of the present disclosure. The memory cell MC2 illustrated in FIG. 13 is similar to the memory cell MC1 illustrated in FIG. 12. Therefore, the same reference numerals are used to refer to the same or liked parts, and its detailed description will be omitted herein. A second memory element 160" is further included in the memory cell MC2. In the previous embodiment, a 1-selector-1-resistor (1S1R) configuration is implemented in the memory cell MC1. However, the disclosure is not limited thereto. For example, referring to FIG. 13 a 1-selector-2-resistor (1S2R) configuration is implemented in the memory cell MC2. In other words, it is appreciated that the memory cell of the disclosure may be implemented with any one of a 1S1R configuration, a 1S2R configuration, a 1S3R configuration, a 1S4R configuration . . . , a 1SxR configuration, etc. It is noted that x is a positive integer.

In some embodiments, in the memory cell MC2 which has the 1S2R configuration, the memory cell MC2 includes one selector 140' and two memory elements 160' and 160". The selector 140' and the memory element 160' is similar to that described in FIG. 12, hence its detailed description will not be repeated herein. As illustrated in FIG. 13, the memory cell MC2 further includes a second memory element 160" disposed in between the memory element 160' and the connecting pad 118'. In other words, the second memory element 160" is electrically coupled to the bottom electrode 104 through the first memory element 160'.

The second memory element 160" may include a top electrode 116", an adhesive layer 114, a storage layer 112", and an electrode 110". The connecting pad 118" is located on the top electrode 116" of the memory element 160". The storage layer 112" is sandwiched between the top electrode 116" and the electrode 110". The adhesive layer 114" is disposed between the top electrode 116" and the storage layer 112". The formation methods and materials of the memory element 160" are the same as or similar to the formation methods and materials of the memory element 160' described previously, and thus are not repeated herein.

In some embodiments, the memory cell MC2 further includes an electrode 105 disposed on and in physical contact with the top electrode 116'. Furthermore, a dielectric layer 103 is formed to surround the electrode 105. The formation and material of the electrode 105 may be similar to the formation and material of the bottom electrode 104, and thus are not repeated herein. Similarly, the formation and material of the dielectric layer 103 may be similar to the formation and material of the dielectric layer 102, and thus are not repeated herein. Furthermore, the selector 140', the memory element 160' and the memory element 160" are electrically coupled to each other in series.

Figure 14:
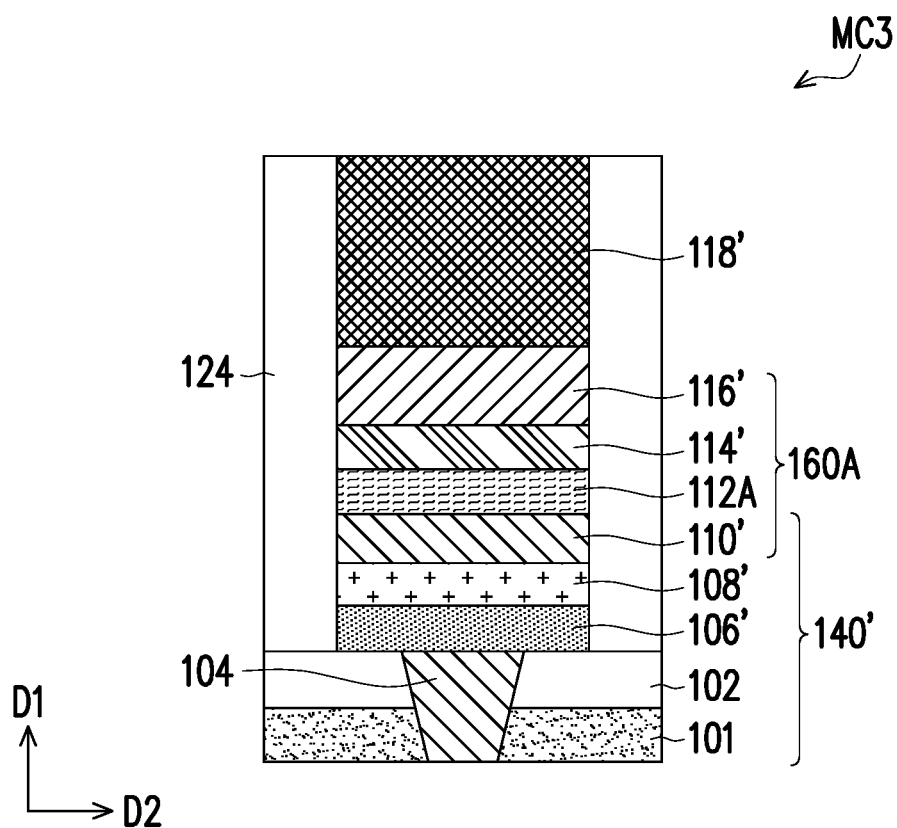
FIG. 14 is a schematic sectional view of a memory cell in accordance with some other embodiments of the present disclosure.

FIG. 14 is a schematic sectional view of a memory cell in accordance with some other embodiments of the present disclosure. The memory cell MC3 illustrated in FIG. 14 is similar to the memory cell MC1 illustrated in FIG. 12. Therefore, the same reference numerals are used to refer to the same or liked parts, and its detailed description will be omitted herein. In the previous embodiments, the memory element 160A is directed to RRAM devices. However, the disclosure is not limited thereto, and the memory element may be applied to a phase change random access memory (PCRAM) device. For example, referring to FIG. 14, the memory cell MC3 includes a storage layer 112A located in between the intermediate layer 114' and the electrode 110', whereby the storage layer 112A include a phase change material.

In some embodiments, the phase change material of the storage layer 112A includes a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The formation of the storage layer 112A may be similar to that of the storage layer 112' illustrated in FIG. 12, and may have substantially the same thickness.

Due to the storage layer 112A being inclusive of the phase change material, the storage layer 112A has a variable phase representing a data bit. For example, the storage layer 112A has a crystalline phase and an amorphous phase which are interchangeable. The crystalline phase and the amorphous phase may respectively represent a binary "1" and a binary "0", or vice versa. Accordingly, the storage layer 112A has a variable resistance that changes with the variable phase of the storage layer 112A. For example, the storage layer 112A has a high resistance in the amorphous phase and a low resistance in the crystalline phase.

In the operation of the memory cell MC3, the data state of the memory cell MC3 is read by measuring the resistance of the memory cell MC3 (i.e., the resistance between the electrode 110' (e.g. serving as the bottom electrode) and the top electrode 116'). The phase of the storage layer 112A represents the data state of the memory cell MC3, the resistance of the storage layer 112A, or the resistance of the memory cell MC3. Furthermore, the data state of the memory cell MC3 may be set and reset by changing the phase of the storage layer 112A.

In some embodiments, the phase of the storage layer 112A is changed by heating. For example, the electrode 110' (or top electrode 116') heats the storage layer 112A to a first temperature that induces crystallization of the storage layer 112A, so as to change the storage layer 112A to the crystalline phase (e.g., to set the memory cell MC3). Similarly, the electrode 110' (or top electrode 116') heats the storage layer 112A to a second temperature that melts the storage layer 112A, so as to change the storage layer 112A to the amorphous phase (e.g., to reset the memory cell MC3). The first temperature is lower than the second temperature. In some embodiments, the first temperature is 100° C. to 200° C. and the second temperature is 500° C. to 800° C. In the disclosure, for the memory cell MC3, the electrode 110' may be referred to as a heater, or the electrode 110' and the top electrode 116' may be together referred to as the heater.

The amount of heat generated by the electrode 110' (or top electrode 116') varies in proportion to the current applied to the electrode 110' (or top electrode 116'). That is, the storage layer 112A is heated up to a temperature (i.e., the second temperature) higher than the melting temperature when a current passes through it. The temperature is then quickly dropped below the crystallization temperature. In the case, a portion of the storage layer 112A is changed to the amorphous state with high resistivity, and thus the state of the memory cell MC3 is changed to a high resistance state. Then, the portion of the storage layer 112A may be reset back to the crystalline state by heating up the storage layer 112A to a temperature (i.e., the first temperature) higher than the crystallization temperature and lower than the melting temperature, for a certain period.

Figure 15:
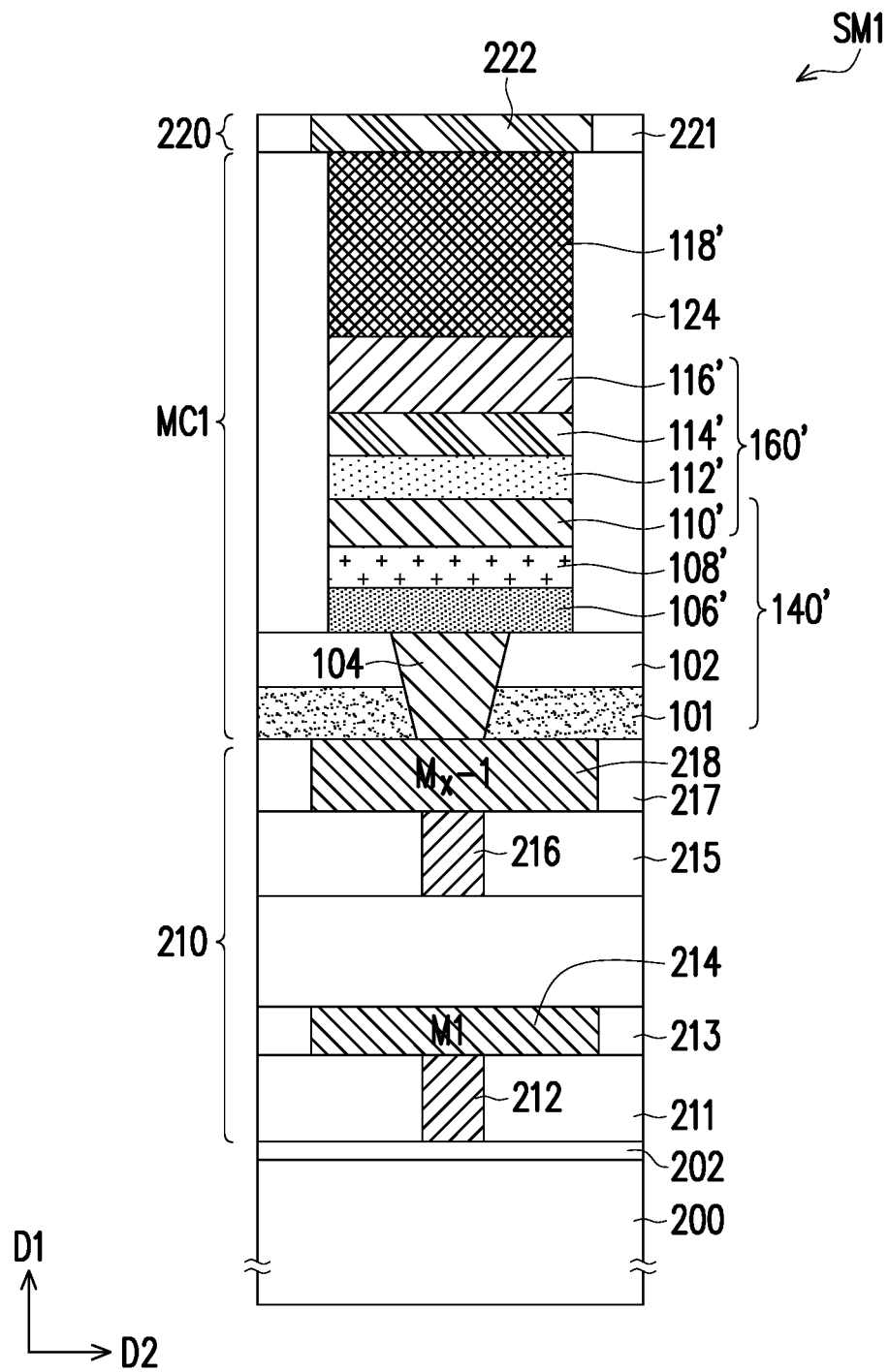
FIG. 15 is a schematic sectional view of a semiconductor device in accordance with some embodiments of the present disclosure.

FIG. 15 is a schematic sectional view of a semiconductor device in accordance with some embodiments of the present disclosure. The memory cell MC1 illustrated in the following embodiments is applied to, but not limited thereto, a RRAM cell. The structures, materials, and processes may be similar to what are shown in, and discussed referring to, FIG. 1 through FIG. 12. The details are thus no repeated herein. It is noted that other memory cells MC2, and MC3 may individually substitute the memory cell MC1 to form the semiconductor device of the example.

Referring to FIG. 15, a semiconductor device SM1 includes a substrate 200, a device region 202, a first interconnect structure 210, the memory cell MC1 and the second interconnect structure 220. In some embodiments, the substrate 200 is a semiconductor substrate, such as a bulk semiconductor, a semiconductor-on-insulator (SOI) substrate, or the like. The substrate 200 may be doped (e.g., with a p-type or an n-type dopant) or undoped. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 200 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 202 is disposed on the substrate 200 in a front-end-of-line (FEOL) process. The device region 202 may include a wide variety of devices. In some embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 202 includes a gate structure, source and drain regions, and isolation structures such as shallow trench isolation (STI) structures (not shown). In the device region 202, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 200. The functions of the devices may include memory, processors, sensors, amplifiers, power distribution, input/output circuitry, or the like.

As illustrated in FIG. 15, a first interconnect structure 210 is disposed on the device region 202, and the device region 202 is disposed between the substrate 200 and the first interconnect structure 210. In some embodiments, the first interconnect structure 210 includes a plurality of build-up layers (M1 to Mx-1, where x is a positive integer of 3 or greater; not labeled) formed with insulating layers and conductive layers. In detail, the first interconnect structure 210 at least includes insulating layers 211, 213, 215, 217, conductive vias 212, 216, and conductive layers 214, 218. The conductive via 212 is disposed on and electrically connected to the device region 202. The conductive layer 214 is disposed on and electrically connected to the conductive via 212. The insulating layers 211, 213 are collectively referred to as an IMD (inter-metal dielectric) layer laterally wrapping the conductive via 212 and the conductive layer 214 to constitute a build-up layer M1. On the other hand, the conductive layer 218 is disposed on and electrically connected to the conductive via 216. The insulating layers 215, 217 are collectively referred to as another IMD layer laterally wrapping the conductive via 216 and the conductive layer 218 to constitute another build-up layer Mx-1. As shown in FIG. 15, the build-up layer M1 (211, 212, 213, 214) is electrically connected to the build-up layer Mx-1 (215, 216, 217, 218) through other build-up layer(s) (not shown), for example. Alternatively, the build-up layer M1 (211, 212, 213, 214) may be electrically connected to the build-up layer Mx-1 (215, 216, 217, 218), directly.

As further illustrated in FIG. 15, the memory cell MC1 and the second interconnect structure 220 are stacked on the first interconnect structure 210 in order along the first direction D1 (build-up direction). The memory cell MC1 is electrically connected to the first interconnect structure 210 and the second interconnect structure 220. The second interconnect structure 220 may include an insulating layer 221 and a connection layer 222. The insulating layer 221 is referred to as yet another IMD layer laterally wrapping the connection layer 222 to constitute a build-up layer (not labelled) or a part of a build-up layer. The insulating layer 221 is disposed on the memory cell MC1 to partially cover the connecting pad 118'. The connection layer 222 of the second interconnect structure 220 is disposed in the insulating layer 221 to electrically connect to the connecting pad 118' included in the memory cell MC1. Furthermore, the bottom electrode 104 of the memory cell MC1 is in contact and electrically connected to the conductive layer 218 of the first interconnect structure 210, and the top electrode 116' of the memory cell MC1 is in contact and electrically connected to the connection layer 222 of the second interconnect structure 220 through the connecting pad 118'.

The connection layer 222 and the conductive layer 218 may provide the voltage to the memory element 160' of the memory cell MC1 for operating the memory functions thereof. On the other hand, the conductive layer 218 may provide the voltages to the selector 140' for controlling the status of the memory cell MC1 (e.g. turning "on" or "off" the memory element 160'). In other embodiments, one of the memory cells MC2, or MC3 are used to replace the memory cell MC1.

In some embodiments, the insulating layers 211, 213, 215, 217 and 221 are independently made of a dielectric material, such as silicon oxide, silicon nitride, silicon oxynitride, a spin-on dielectric material, or a low-k dielectric material. The conductive layers 214, 218 and the connection layer 222 each may be a conductive trace/line/wire. The conductive layers 214, 218, the connection layer 222 and the conductive vias 212, 216 may independently include metals or metal alloys including one or more of Al, AlCu, Cu, Ti, TiN, W, or the like. The conductive layers 214, 218 and the connection layer 222 are a portion of a current driving circuit (not shown) to provide voltages to the memory cell MC1. In some embodiments, the conductive vias 212, 216, and the conductive layers 214, 218 are formed by a dual damascene process. That is, the conductive vias 212, 216 and the conductive layers 214, 218 may be formed simultaneously. In some embodiments, the memory cell MC1 may be disposed between any two adjacent conductive layers in the back-end-of-line (BEOL) structure. In certain embodiments, the fabricating process of the memory cell MC1 may be compatible with the BEOL process of the semiconductor device, thereby simplifying process steps and efficiently improving the integration density.

Figure 16:
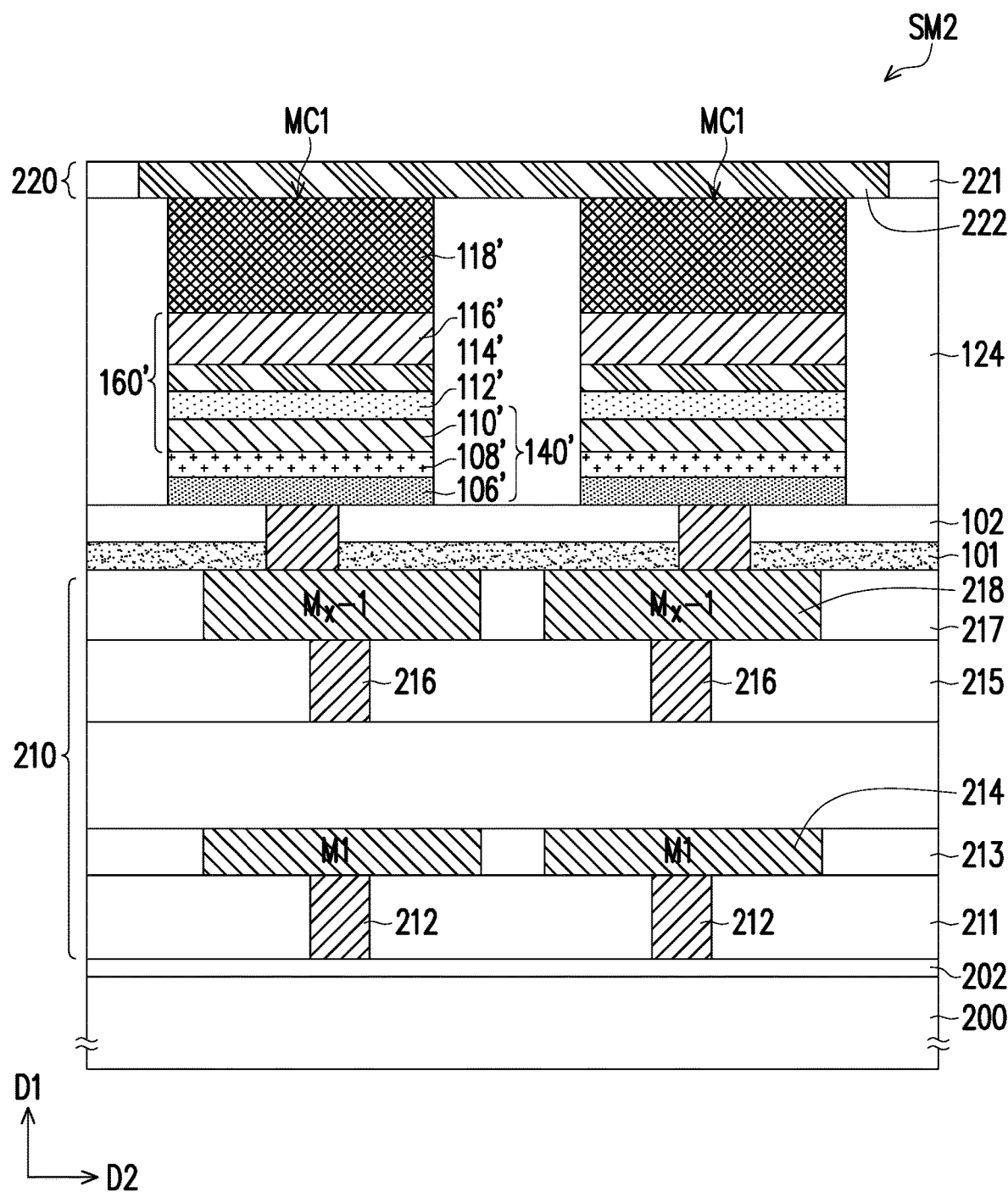
FIG. 16 is a schematic sectional view of a semiconductor device in accordance with some other embodiments of the present disclosure.

FIG. 16 is a schematic sectional view of a semiconductor device in accordance with some other embodiments of the present disclosure. The semiconductor device SM2 illustrated in FIG. 16 is similar to the semiconductor device SM1 illustrated in FIG. 15. Therefore, the same reference numerals are used to refer to the same or liked parts, and its detailed description will be omitted herein. A plurality of memory cells MC1 are illustrated in the semiconductor device SM2 of FIG. 16. For example, as illustrated in FIG. 16, two memory cells MC1 are located in between the first interconnection structure 210 and the second interconnection structure 220. In some embodiments, the two memory cells MC1 are electrically coupled to one another through the first interconnection structure 210. The two memory cells MC1 may correspond to the memory cell MC1 illustrated in FIG. 12, thus its detailed description will be omitted herein.

Although two identical memory cells MC1 are illustrated herein, it is appreciated that two identical memory cells (e.g. MC1, MC2, or MC3) or two different memory cells (e.g. MC1, MC2, or MC3) may be included in the semiconductor device. For example, a semiconductor device may include a memory cell MC1 and a memory cell MC2; the semiconductor device may include a memory cell MC1 and a memory cell MC3; the semiconductor device may include a memory cell MC2 and a memory cell MC3. Furthermore, the number of memory cells (MC1, MC2, and MC3) located in the memory region MR of the semiconductor device is not limited to one or two, but can be three or more. In case where a plurality of memory cells (MC1, MC2, and MC3) exist in the semiconductor device, the memory cells (MC1, MC2, and MC3) may be used alone (all the same type of memory cells), or be used in combination (different types of memory cells).

In the above-mentioned embodiments, in each of the memory cells, the selector is designed to include an intermediate layer inserted between the electrode and the selector layer. The intermediate layer may be served as a glue layer, an adhesive layer, or/and a barrier layer to avoid peeling or bubbling. Further, the sidewall profile of the intermediate layer may be controlled so that the selector layer has a top surface area greater than a top surface area of the electrode on the intermediate layer to avoid bending or collapse of the memory cell.

In accordance with some embodiments of the present disclosure, a memory cell includes a selector disposed over a substrate, a memory element and a connecting pad. The selector includes a bottom electrode, an ovonic threshold switch layer on the bottom electrode, an inter-electrode over the ovonic threshold switch layer, and an intermediate layer between the ovonic threshold switch layer and the inter-electrode. The memory element is disposed on the selector. The connecting pad is disposed on the memory element.

In accordance with some other embodiments of the present disclosure, a semiconductor device includes a first interconnect structure, a selector, a memory element, a connecting pad, and a second interconnect structure. The first interconnect structure is disposed on a substrate; a selector disposed on the first interconnect structure. The selector includes: a bottom electrode on the second electrode; an ovonic threshold switch layer on the bottom electrode; an inter-electrode over the ovonic threshold switch layer; an intermediate layer between the ovonic threshold switch layer and the inter-electrode. The memory element is disposed on the selector. The connecting pad is disposed on the memory element. The second interconnect structure is disposed on the memory element and electrically connected to the connecting pad.

In accordance with yet another embodiment of the present disclosure, a method of forming a memory cell is described. The method of forming a memory cell includes forming a selector over a substrate, including: forming a bottom electrode; forming an ovonic threshold switch layer on the bottom electrode; forming an inter-electrode over the ovonic threshold switch layer; forming an intermediate layer between the ovonic threshold switch layer and the inter-electrode; and forming a memory element on the selector; and forming a connecting pad on the memory element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a selector disposed over a substrate, wherein the selector comprises:
     a bottom electrode;
     an ovonic threshold switch layer on the bottom electrode;
     an inter-electrode over the ovonic threshold switch layer; and
     an intermediate layer between the ovonic threshold switch layer and the inter-electrode, wherein the intermediate layer has a curved sidewall extending from a top surface of the ovonic threshold switch layer to a bottom surface of the inter-electrode;
   a memory element disposed on the selector; and
   a connecting pad disposed on the memory element.

2. The memory cell of claim 1, wherein the memory element comprises:
   the inter-electrode;
   a top electrode over the inter-electrode; and
   a storage layer located between the inter-electrode and the top electrode.

3. The memory cell of claim 2, wherein the intermediate layer comprises a metal material different from the inter-electrode.

4. The memory cell of claim 1, wherein a width of the intermediate layer increases toward the bottom electrode.

5. The memory cell of claim 1, wherein the curved sidewall is concave into the intermediate layer.

6. The memory cell of claim 1, wherein a hydrophilicity of the intermediate layer is greater than a hydrophilicity of the ovonic threshold switch layer, and less than a hydrophilicity of the inter-electrode.

7. A semiconductor device, comprising:
   a first interconnect structure disposed on a substrate;
   a selector disposed on the first interconnect structure, wherein the selector comprises:
     a bottom electrode;
     an ovonic threshold switch layer on the bottom electrode;
     an inter-electrode over the ovonic threshold switch layer;
     an intermediate layer between the ovonic threshold switch layer and the inter-electrode, wherein the intermediate layer has a first curved sidewall, the first curved sidewall includes a first portion physically connected to a top surface of the ovonic threshold switch layer and a second portion between the first portion and the inter-electrode, the first portion of the first curved sidewall has a first included angle with respect to a normal direction of the substrate, and the first included angle is in a range of 30 degrees to 60 degrees; and
   a memory element disposed on the selector;
   a connecting pad disposed on the memory element; and
   a second interconnect structure disposed on the memory element and electrically connected to the connecting pad.

8. The semiconductor device of claim 7, wherein the memory element comprises:
   the inter-electrode;
   a top electrode over the inter-electrode; and
   a storage layer located between the inter-electrode and the top electrode.

9. The semiconductor device of claim 8, wherein the intermediate layer comprises a metal material while the bottom electrode, the inter-electrode and the top electrode comprise metal compound.

10. The semiconductor device of claim 9, wherein the metal material of the intermediate layer comprises tungsten, and the bottom electrode, the inter-electrode and the top electrode comprise metal nitride.

11. The semiconductor device of claim 10, wherein the memory element further comprises:
    an adhesive layer located between the top electrode and the storage layer, and the adhesive layer is different from the intermediate layer.

12. The semiconductor device of claim 8, wherein the inter-electrode has a second curved sidewall, the second curved sidewall of the inter-electrode includes a first portion physically connected to a top surface of the intermediate layer and a second portion between the first portion of the second curved sidewall and the storage layer, the first portion of the second curved sidewall has a second included angle with respect to the normal direction of the substrate, and the first included angle of the intermediate layer is greater than the second included angle of the inter-electrode.

13. The semiconductor device of claim 12, wherein the ovonic threshold switch layer has a sidewall, the sidewall includes a first portion physically connected to a top surface of the first interconnect structure and a second portion between the first portion of the sidewall and the intermediate layer, the first portion of the sidewall has a third included angle with respect to the normal direction of the substrate, and the second included angle of the inter-electrode is greater than the third included angle of the ovonic threshold switch layer.

14. The semiconductor device of claim 7, wherein a top width of the intermediate layer is equal to or smaller than a bottom width of the intermediate layer.

15. The semiconductor device of claim 7, wherein a bottom width of the inter-electrode is smaller than a top width of the ovonic threshold switch layer.

16. The semiconductor device of claim 7, wherein a hydrophobicity of the intermediate layer is greater than a hydrophobicity of the inter-electrode, and less than a hydrophobicity of the ovonic threshold switch layer.

17. A memory cell, comprising:
a selector disposed over a substrate, wherein the selector comprises:
a bottom electrode;
an ovonic threshold switch layer on the bottom electrode;
an intermediate layer on the ovonic threshold switch layer, wherein a width of the intermediate layer increases toward the ovonic threshold switch layer, the intermediate layer has an edge portion, and the edge portion is bent downwardly from a top surface of the ovonic threshold switch layer to cover a sidewall of the ovonic threshold switch layer;
an inter-electrode on the intermediate layer; and
a memory element disposed on the selector.

18. The memory cell of claim 17, wherein the memory element comprises:
the inter-electrode;
a top electrode over the inter-electrode; and
a storage layer located between the inter-electrode and the top electrode.

19. The memory cell of claim 17, wherein a width of the inter-electrode increases toward the ovonic threshold switch layer.

20. The memory cell of claim 17, wherein the intermediate layer has curved sidewalls.

* * * * *